Aug. 30, 1966 TAKESHI NAKATOGAWA ET AL 3,270,255

SILICON RECTIFYING JUNCTION STRUCTURES FOR ELECTRIC POWER AND PROCESS OF PRODUCTION THEREOF

Filed Oct. 17, 1962

United States Patent Office 3,270,255
Patented August 30, 1966

3,270,255
SILICON RECTIFYING JUNCTION STRUCTURES FOR ELECTRIC POWER AND PROCESS OF PRODUCTION THEREOF

Takeshi Nakatogawa and Takuzo Ogawa, Hitachi-shi, Ibaragi-ken, Masatoshi Hara, Morino, Machida-shi, Tokyo, and Sadao Okano, Hitachi-shi, Ibaragi-ken, Japan, assignors to Kabushiki Kaisha Hitachi Seisakusho, Tokyo-to, Japan, a joint-stock company of Japan
Filed Oct. 17, 1962, Ser. No. 231,226
2 Claims. (Cl. 317—234)

This invention relates to silicon rectifying junction structures for electric power use and to a process for producing the same.

It is an object of the present invention to provide new silicon rectifying junction structures of high breakdown voltage, diffused type particularly suitable for rectification of high-voltage, high-power current.

It is another object of the invention to provide an extremely effective and suitable production process whereby high breakdown voltage, silicon rectifying junction structures of highly desirable characteristics can be obtained.

It is common practice in the art to use pn junctions or pin junctions in semiconductor rectifying junction regions for power. Here, *p* designates an acceptor impurity region, *n* designates a donor impurity region, and *i* designates intrinsic or a high resistivity region wherein only a minute quantity of acceptors or donors is remaining.

In general, pin junctions have been highly regarded for power use under consideration of breakdown voltage; and, for obtaining a uniform, wide junction surface, diffusion by the vapor-phase method or the painting method has been considered to be relatively easier than the alloying method and is being practiced widely.

The nature of the present invention, its details, and the manner in which its objects may best be achieved will be apparent by reference to the following description when taken in conjunction with the accompanying illustrations in which like parts are designated by like reference characters, and in which.

To facilitate a full understanding of the nature of the present invention and the significance of its advantageous features, a description of a conventional silicon rectifying junction structure will first be presented for comparison purpose.

Figure 1:
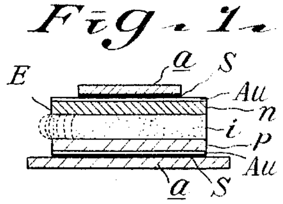
FIG. 1 is a sectional view showing a conventional silicon rectifying junction structure of diffused type.

Referring to FIG. 1, which shows an example of a conventional pin junction structure obtained by diffusion treatment, the principal part of this junction structure consists of an i-type silicon element *i* which is of high resistivity and has been monocrystallized, an n-type impurity region *n* which has been obtained by diffusion treatment of phosphorous and is disposed above the said element *i*, and a p-type impurity region *p* which has been obtained by diffusion treatment of boron and is disposed below the said element *i*.

Although in the drawing, only sectional views composed of rectangles are shown, practical products which these illustrations represent are actually formed as extremely thin disks, and gold-plated layers A*u* are applied to the upper and lower surfaces of each junction structure so as to facilitate soldering for the attachment of electrodes and, moreover, to provide good electrical connection. Onto the outer surfaces of these gold-plated layers A*u* are secured, by solder S, support plates *a* made of a substance, such as molybedenum, tungsten-nickel alloy, which have a thermal expansion coefficient approaching that of silicon and are good electrical and thermal conductors. These support plates *a* have the function of preventing mechanical stress due to thermal cycles at the time of manufacture and at the time of operation from being imparted to the junction structure.

The case wherein the pin-type rectifying junction structure as shown in FIG. 1 is used for rectification of high alternating-current voltage will now be considered. If the region *p* is positive, it will assume regular or forward chaacteristics, and the junction structure will indicate almost no impedance, wherefore a large current determined by the load and the applied voltage will flow. If the region *p* is negative, it will assume reverse characteristics, and the junction structure will indicate a remarkably high impedance, wherefore almost no current will flow.

It is known, through the results of experiments that, in the case wherein voltage is impressed in the reverse direction, the junction structure is destroyed when the voltage exceeds a certain value. It has ordinarily been considered that, in order to increase the destruction voltage, the layer *i* should be made as thick as possible. However, increasing the thickness of the layer *i* results in a deterioration of the forward characteristics, particularly a lowering of the allowable current capacity. Accordingly, it is necessary to make the junction structure as thin as possible.

In making a rectifying junction for high power and high breakdown voltage, moreover, in addition to the latent existence of the above conflicting difficulties, there exist various problems such as the correctness of the crystallization of the semiconductor element, the conditions of such treatment as etching or heat treatment, operational atmosphere, and the gas-tightness at the time of fabricaion of the junction as a rectifier, which have a great influence on the characteristics. Accordingly, much attention is paid to these considerations in the manufacture of these rectifying junctions. However, irrespective of how much careful attention is paid, with a junction structure of the construction shown in FIG. 1, a rectifying junction structure having amply desirable charactistics for high power and high breakdown voltage cannot be obtained.

Figure 2:
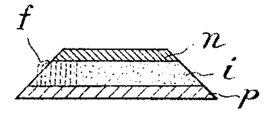
FIG. 2 is a sectional view showing one kind of diffused-type, silicon rectifying junction structure used for increasing reverse breakdown voltage.

That is, it has been found, through careful observation of the phenomenon of electrical destruction of insulation in the case wherein a voltage of reverse direction is impressed on a junction structure such as that shown in FIG. 1, that a gaseous discharge accompanied by luminescence always occurs first with the periphery of the junction region in the vicinity of the peripheral end portion E as the point of origin. This discharge causes electrical destruction of the junction structure, whereby the junction deteriorates. The junction structure shown in FIG. 2 is one example of an attempt to prevent this discharge phenomenon by increasing the creeping distance of the peripheral side surface. It has been confirmed by numerous experiments, however, that such an expedient of using a trapezoidal form, by itself, cannot cause a change in the breakdown voltage.

The present invention, based on the results of numerous experiments, determines the construction of high-power, high-breakdown-voltage, silicon junction structures.

The principle of the present invention may best be understood by first considering the state of generation and distribution of the lines of electric force in the case wherein, on the junctions shown in FIGS. 1 and 2, voltage is applied in the reverse direction. The layer *i*, in substance, is a high specific resistance material and may be considered to be an electrical insulating substance. Then, the lines of electric force originate at the n-type impurity region and end at the p-type impurity region as indicated by the dotted lines. When the case of FIG. 1 is considered, the lines of electric force become concentrated in the peripheral end portion E as in the case of a capacitor, and it may be considered that gaseous discharge takes place in the vicinity thereof on the basis of breakdown due to the so-called edge effect.

In the case shown in FIG. 2, wherein the rectifying junction structure is machined to a trapezoidal form to lengthen the elemental length of the side, the lines of electric force, at the ends of the junction regions, begin from the n-type region, as indicated by the reference letter *f*, and first extend into the atmosphere. Then they infiltrate into the layer *i* and, passing therethrough, reach the p-type region. When the lines of electric force are almost generated to span the atmosphere and the interior of the silicon at the end portion in the above manner, since the dielectric constant of the silicon is much higher than that of the atmosphere, an intense electric field develops in the atmospheric portion, as is apparent from the theory of electromagnetic phenomena. This effect becomes more pronounced as the distance tranversed by the lines of electric force through the atmosphere becomes shorter. This intense electric field causes gaseous discharge, which causes deterioration of the side face of the silicon, and eventually the junction structure is destroyed. Even in this example wherein, by using a trapezoidal form, the elemental length of the layer *i* is made to be almost twice that in the case of FIG. 1, luminescence was observed to develop at various spots on the side face and become a gaseous discharge. It was found that the voltage at destruction in this case was almost the same as that in the case illustrated in FIG. 1, which fact supports the theoretical reasoning presented herein.

With consideration of the above points, the present invention seeks, in one aspect, to provide a silicon rectifying junction structure of a construction whereby the side surface length is made long while, at the same time, great care is taken to prevent local concentration of lines of electric force in the atmosphere, and the lines of electric force are caused to pass through the silicon of the layer *i* without emerging into the atmosphere. In an inseparable, corollary aspect of the invention, it seeks to provide the most effective and suitable method of producing the above junction structure.

Figure 3:
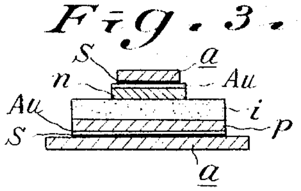
FIG. 3 is a sectional view showing one embodiment of the silicon rectifying junction structure for power according to the present invention.

Referring to FIG. 3, which illustrates a section of an embodiment of the invention, it will be seen that a p-type or n-type impurity region is caused to rise from the center of a layer *i* of silicon basic material, and, moreover, the real surface of the layer *i* is thoroughly treated and is so constructed as to be exposed. In making a junction structure of this construction, when an impurity, for example, of n type, is to be attached, a p-type or n-type impurity region is first formed by diffusion treatment on the basic material *i*, then gold plating A*u* is applied on this structure. Next, a wax layer $W_1$ is applied to coat the central portion of the upper surface, and a wax layer $W_2$ is applied to coat the entire lower surface or an even large part. By means of aqua regia (a mixture of nitric and hydrochloric acids), the surplus gold plating A*u* at the parts not covered by the wax is removed. Then, by mixed solution of the hydrofluoric acid, and nitric acid chemical etching is carried out to expose the peripheral basic material surface of layer *i* other than the center part. Finally, support plates *a* are attached to the upper and lower surfaces as in the case shown in FIG. 1 to produce the finished product shown in FIG. 3.

The case when a reverse voltage is impressed on the structure of FIG. 3 will now be considered. The principal distribution of the lines of electric force in the peripheral end part of the basic material in this case is such that these lines originate from the layer *n*, and all lines pass through the silicon layer *i* to reach the layer *p*. There is almost no distribution of the lines of electric force in the atmosphere, almost all of the lines passing through the body of the layer *i*. Moreover, since the path for gaseous discharge is lengthened, it is possible to obtain a silicon rectifying junction structure of remarkably high breakdown voltage.

The actual etching conditions and the dimensions of the parts coated with wax must be selected so as to satisfy the above-stated requirements. In the actual practice, it has been found that for a rectifying junction rated at 200 amperes and a breakdown voltage of 2000 volts, a diameter of 18 millimeters or less for the protruding part caused to rise in the center, for a silicon basic material layer *i* of 21-millimeter diameters, gives a good dimensional relation in mass production. However, because the thickness of the rectifying junction structure is ordinarily of the order of 0.5 mm. or slightly less, and the thickness of the layer *i* is approximately one-half of the said thickness of the rectifying junction structure, in order to cause the principal distribution of the lines of electric force to exist in the silicon basic material of layer *i* at the same time that the side surface length is made long, it is sufficient to make the radial length of exposed part of the upper surface of the layer *i* equal to, or greater than, the thickness of the layer *i*.

The height of the impurity layer which is caused to rise above the layer *i*, that is, the depth of etching if this impurity layer is to be formed by etching, must be determined with care being taken to prevent stepwise connection of the interface of the impurity region and the layer *i* to the upper exposed surface of the layer *i*. In broad terms of configuration, it is necessary that the said height be ⅓ or smaller fraction of the thickness of the layer *i*. If a stepwise connection is made, or if the etching depth becomes more than ⅓ of the layer *i*, the distribution of lines of electric force emanating from the interface of the impurity layer and the layer *i* will, as a natural result, span space (in the atmosphere) and the silicon basic material of the layer *i*, wherefore increasing of the breakdown voltage cannot be realized, as was explained in regard to the structure of FIG. 2.

The use of a mesa form for one side of a pn junction for the purpose of increasing the switching speed in such a device as a computer diode has been practiced. Such applications, however, differ fundamentally from the present invention in object, specific effect, and construction i.e., the effect of utilizing surface recombination in mesa diodes is not expected and aimed in this pin junction for power. And this fact will be appreciated from the foregoing description.

For causing distribution of all lines of electric force in the silicon layer *i*, the forming of a depression in the center of the silicon layer *i*, instead of a protruding part rising therefrom, and the causing of the interface between the impurity and the silicon layer *i* to be concave can be easily conceived. Such a method, however, is accompanied by extremely complicated operations in the production process and is difficult. Accordingly, this method cannot be said to be a satisfactory method in a practical sense. That is, to produce a concave structure by diffusion treatment, the center of the silicon basic material must be hollowed out, beforehand, by machining or by chemical etching. Then, the entire surface must be treated by the vapor-phase or painting diffusion method, after which the diffused part of the periphery must be removed.

As another method, an oxidation mask method whereby a diffused region is formed at only one part of the center may be conceived, but in actual practice, the masking effect due to an oxide film cannot be considered to be perfect. Accordingly, if even a small quantity of impurity penetrates through the masking and infiltrates into the interior of the silicon of the layer *i*, the result will be a greatly detrimental effect on the reverse characteristics. As a consequence, in removing the oxide layer, it becomes necessary to remove the layer deeply to a considerable thickness, and the configuration, in actual effect, becomes convex, thereby losing its original significance.

Such methods as the foregoing involve a considerable number of process steps as compared to the case of the present invention. In general, in the handling of semiconductor elements, a certain percentage of defective material always develops because of carelessness and contamination from the outside. Therefore, for the same performance, a method with a large number of process steps entails a vital disadvantage and becomes difficult to apply.

While, in the above description, the vital disadvantage, in practice, of the concave form has been pointed out, there are various methods of erecting a p-type or n-type impurity layer on top of the silicon basic material of the layer *i*. Of these, the chemical etching method is the easiest and most effective. However, in exposing the real surface of the silicon basic material of the layer *i* by etching, various precautions are necessary, as described below.

Figure 4:
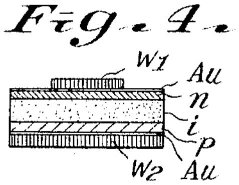
FIG. 4 is a sectional view indicating one process step in the production of the silicon rectifying junction structure for power according to the invention.
Figure 5:
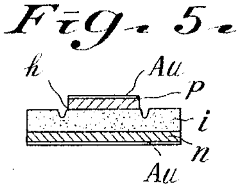
FIG. 5 is a sectional view showing a silicon rectifying junction structure for power which appears to be similar to but is actually different from that of the present invention and has undesirable characteristics.

In the first place, in the case of the process step indicated in FIG. 4, that is, the step of coating the required center part with wax and effecting chemical etching by dissolving the gold plating with aqua regia, the etching must always be carried out from the n side. As has been confirmed through experimentation, if the etching is carried out from the p side, a groove as indicated by the reference letter *h* will develop at the periphery of the root part of the protruding part on the p side of the junction structure, as indicated in FIG. 5. If such a groove develops, lines of electric force will traverse the atmospheric space in this groove, as described hereinbefore, whereby a concentration of intense electric field will occur in this space in this groove, thereby facilitating the generation of gaseous discharge. With the above condition as a beginning, the rectifying junction structure will deteriorate to final destruction, as afore-described.

The development of the groove *h* does not occur when etching is carried out from the n-type side but occurs conspicuously when etching is carried out from the p-type side. This difference may be considered to be due to the difference in ionization tendency between the p-type impurity region and the n-type impurity region, that is, the difference in etching speed. The reason for the groove *h* being formed particularly at the periphery of the root part of the p-type protrusion may be thought to be that the p-type impurity region and gold-plated layer cause, through the difference in chemical activity, a phenomenon in the etching liquid similar to chemical electrolytic action, whereby particularly the gold plating periphery, that is, the root periphery of the p-type protrusion is dissolved at a rapid rate. As a result of further reasonable considerations, an excellent method of causing, by etching, a p-type impurity region to protrude without any inconvenience, as will be described hereinbelow, was discovered.

Figure 6:
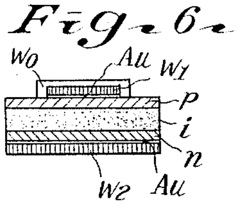
FIGS. 6 and 7 are sectional views showing two examples of silicon rectifying junction structures for power produced by other methods according to the present invention.

Referring to FIG. 6, in order to raise the p-type impurity region, the appropriate parts are first coated with wax layers $W_1$ and $W_2$, and the surplus gold plating is removed by means of aqua regia. Next, by means of a wax coating W*o*, the exposed part of the gold plating A*u* is completely coated, and then the etching treatment is carried out.

Figure 7:
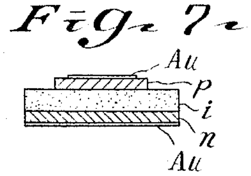

With the above-described procedure, a groove such as the groove *h* of FIG. 5 is not created at the root periphery of the p-type protrusion, as shown in FIG. 7, although the same chemical etching process is used.

Figure 8:
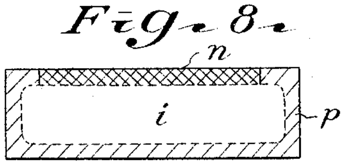
FIG. 8 is a sectional view of a silicon monocrystalline element wherein, by painting, diffusion, acceptor and donor impurity regions have been formed.
Figure 9:
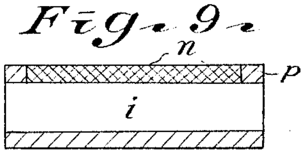
FIG. 9 is a sectional view for description of the case wherein an element which has undergone diffusion treatment as indicated in FIG. 8 is etch cut.
Figure 10:
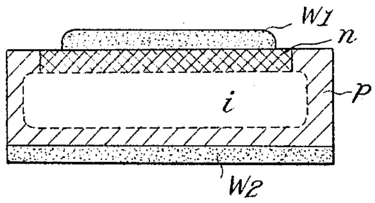
FIG. 10 is a sectional view for a description of one process step for obtaining a rectifying junction structure according to the invention from an element which has been diffusion treated as indicated in FIG. 8.
Figure 11:
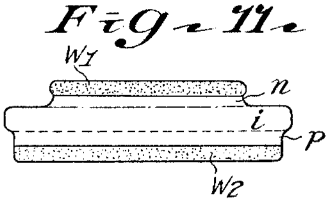
FIG. 11 is a sectional view showing a rectifying junction structure of the invention which has been obtained from an element which has been diffusion treated as indicated in FIG. 8.

A further examination of the above case wherein the forming of the n-type and p-type impurity regions in various rectifying junction structures is accomplished by a diffusion method, particularly the painting diffusion method, reveals that the acceptor and donor impurity regions are mixed at the crystal end parts, and, for example, in the case in which the acceptor is dominant at these parts, the construction becomes that illustrated in FIG. 8. In the case of painting diffusion, this kind of turning around of an acceptor or a donor is ordinarily observed at points within 1 mm. from the crystal ends. In the production of a rectifying junction of high capacity, the ordinary method used is that of removing the undesirable parts of the crystal plate periphery by etch cutting so as to increase the breakdown voltage on the basis of the reasons presented hereinbefore. When the above-mentioned turning around region of the impurity is large, however, if the crystal periphery is not removed to a sufficient depth by etch cutting, a *pip* (or an *nin*) construction will be left at one part of the rectifying junction structure as shown in FIG. 9, and an undesirable effect will be imparted to the reverse-direction characteristics. In order to prevent this result, a coating of such a substance as wax is applied as shown in FIG. 10, and the afore-described forming process is carried out. By this procedure, the crystal periphery is also etched, and the construction becomes that indicated in detail in FIG. 11. Accordingly, the undesirable parts are amply removed in the same manner as they would be by amply deep etch cutting of the periphery. Therefore, since the basic material is provided, from the very beginning, with dimensions close to the final diameter, there is no necessity of etch cutting, and it is possible, by the above forming operation, to obtain an excellent rectifying junction structure with, moreover, extreme convenience in the production process. Furthermore, in the case of forming by the above method, by bonding the electrode part of the side which is larger upon being finished to a cooling base body, it is possible to utilize a bonding surface area which is much larger than that of a junction structure which has been etch cut, and the thermal conductance of the rectifier also increases.

As disclosed in the foregoing description, the present invention had its start from the concept of the pin junction described in Japanese Patent No. 216,270 and involves the conception of causing the surface of a silicon basic material, *i* layer being of high resistivity to be exposed to the planar part and the curved surface part of ring form of the side around a protrusion. The invention, in conjunction with the application of a new method devised for reducing the said conception to practice, provides a silicon rectifying junction structure which has a high breakdown voltage and is well suited for rectification of high power.

Heretofore, there have been attempts to obtain high breakdown voltage on the basis of pn junctions, but in such cases, there is a limit to reverse breakdown voltage of the junction itself. Accordingly, it is necessary to resort to various complicated procedures in preparing the peripheral part of the junction, whereby such a method has the vital disadvantage of requiring a large number of process steps. The present invention, on the other hand, provides, through a simple production method, a silicon rectifier of high breakdown voltage for power which is excellent in yield and has highly desirable characteristics which, hitherto, have been considered difficult to attain.

Since it is obvious that many changes and modifications can be made in the above-described details without departing from the nature and spirit of the invention, it is to be understood that the invention is not to be limited to the details described herein except as set forth in the appended claims.

What is claimed is:

1. A high capacity silicon rectifying device for power use comprised of a basic circular intrinsic monocrystalline silicon wafer, a diffused impurity region of one conductivity, the radius of which is smaller than that of said wafer by an amount corresponding to the thickness of said wafer, adjacent to and concentric with said intrinsic region on one side of said wafer, another diffused impurity region of opposite conductivity adjacent to and coextensive with said intrinsic region disposed on the opposite side of said wafer, wherein the thickness of said wafer is uniform and is smaller than its radius, the depth of said impurity regions being substantially ⅓ or less of the intrinsic region, and conductive contact means to said different impurity regions.

2. The device as defined in claim 1, wherein the outer surfaces of said impurity regions are gold plated.

References Cited by the Examiner

UNITED STATES PATENTS

| | | | |
|---|---|---|---|
| 2,794,846 | 6/1957 | Fuller | 317—235 |
| 2,820,932 | 1/1958 | Looney | 317—240 |
| 2,947,924 | 8/1960 | Pardue | 317—235 |
| 2,967,344 | 1/1961 | Mueller | 317—235 |
| 2,983,854 | 5/1961 | Pearson | 317—235 |
| 3,059,124 | 10/1962 | Fuller | 307—88.5 |
| 3,078,196 | 2/1963 | Ross | 317—235 |
| 3,081,404 | 3/1963 | Memelink | 307—88.5 |
| 3,169,197 | 2/1965 | Memelink | 307—88.5 |

JOHN W. HUCKERT, *Primary Examiner.*

DAVID J. GALVIN, *Examiner.*

A. S. KATZ, R. SANDLER, J. D. KALLAM, *Assistant Examiners.*